(12) United States Patent
Wei

(10) Patent No.: US 9,847,423 B1
(45) Date of Patent: Dec. 19, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventor: Huang-Ren Wei, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/480,340

(22) Filed: Apr. 5, 2017

(30) Foreign Application Priority Data

Mar. 17, 2017 (CN) .......................... 2017 1 0160665

(51) Int. Cl.
| | | |
|---|---|---|
| H01L 21/00 | (2006.01) | |
| H01L 29/78 | (2006.01) | |
| H01L 29/66 | (2006.01) | |
| H01L 29/06 | (2006.01) | |
| H01L 21/8234 | (2006.01) | |
| H01L 21/8238 | (2006.01) | |
| H01L 21/311 | (2006.01) | |
| H01L 21/02 | (2006.01) | |

(52) U.S. Cl.
CPC ........ *H01L 29/785* (2013.01); *H01L 21/0217* (2013.01); *H01L 21/02164* (2013.01); *H01L 21/31111* (2013.01); *H01L 21/823431* (2013.01); *H01L 21/823878* (2013.01); *H01L 29/0649* (2013.01); *H01L 29/66795* (2013.01)

(58) Field of Classification Search
CPC ............. H01L 29/785; H01L 21/02164; H01L 21/0217; H01L 21/31111; H01L 21/823431; H01L 21/823878; H01L 29/0649; H01L 29/66794
See application file for complete search history.

(56) References Cited

U.S. PATENT DOCUMENTS 9,570,442 B1 * 2/2017 Liu ..................... H01L 27/0886

OTHER PUBLICATIONS

Tseng, Title of Invention: Semiconductor Device and Method for Fabricating the Same, U.S. Appl. No. 14/844,004, filed Sep. 3, 2015.
Tseng, Title of Invention: Semiconductor Structure and Method of Forming the Same, U.S. Appl. No. 15/250,924, filed Aug. 30, 2016.
Hsu, Title of Invention: Complementary Metal Oxide Semiconductor Device and Method of Forming the Same, U.S. Appl. No. 15/446,009, filed Mar. 1, 2017.

* cited by examiner

*Primary Examiner* — Nicholas Tobergte
(74) *Attorney, Agent, or Firm* — Winston Hsu

(57) ABSTRACT

A method for fabricating semiconductor device includes the steps of: forming a fin-shaped structure on a substrate; forming a shallow trench isolation (STI) around the fin-shaped structure; removing part of the fin-shaped structure and part of the STI to form a first trench and removing part of the STI adjacent to the fin-shaped structure to form a second trench; and forming a dielectric layer into the first trench and the second trench to form a first single diffusion break (SDB) and a second single diffusion break.

18 Claims, 5 Drawing Sheets

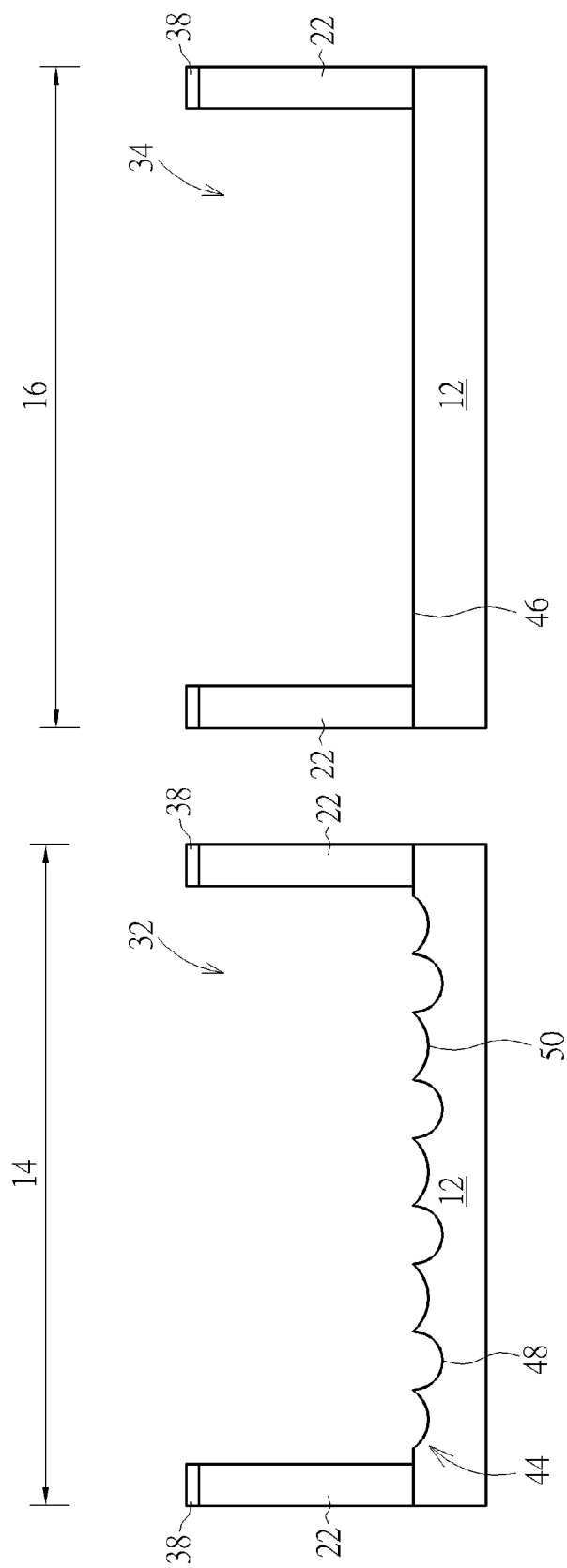

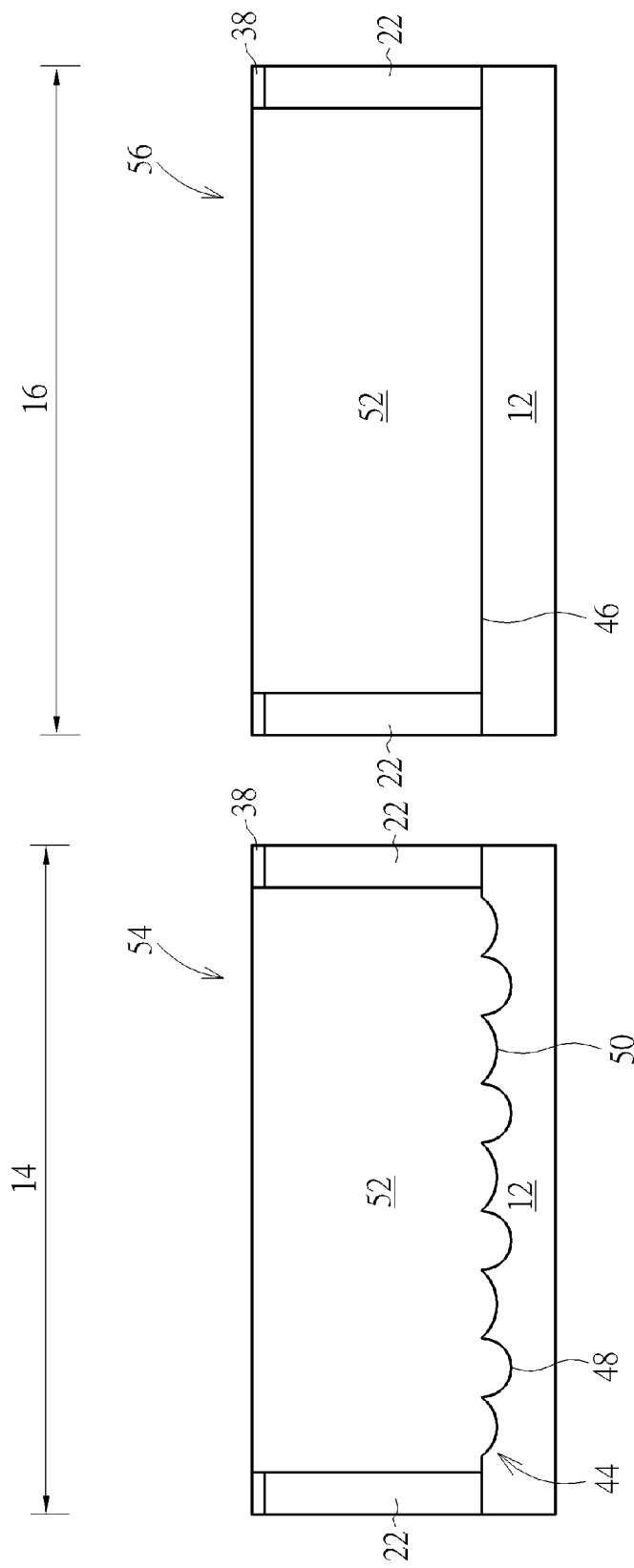

US 9,847,423 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method for forming single diffusion break (SDB) in the shallow trench isolation (STI) adjacent to fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, fin-shaped structure may be divided and insulating material is deposited to form shallow trench isolation (STI). However, the STI formed between fin-shaped structures often results in expansion and affects the formation of gate structure thereafter. Hence, how to improve the current FinFET fabrication and structure for resolving this issue has become an important task in this field.

SUMMARY OF THE INVENTION

According to an embodiment of the present invention, a method for fabricating semiconductor device includes the steps of: forming a fin-shaped structure on a substrate; forming a shallow trench isolation (STI) around the fin-shaped structure; removing part of the fin-shaped structure and part of the STI to form a first trench and removing part of the STI adjacent to the fin-shaped structure to forma second trench; and forming a dielectric layer into the first trench and the second trench to form a first single diffusion break (SDB) and a second single diffusion break.

According to another aspect of the present invention, a semiconductor device includes: a fin-shaped structure extending along a first direction on a substrate, wherein the fin-shaped structure comprises a first portion and a second portion; a shallow trench isolation (STI) around the fin-shaped structure; a first single diffusion break (SDB) extending along a second direction between the first portion and the second portion of the fin-shaped structure; and a second SDB extending along the second direction in the STI and adjacent to the fin-shaped structure.

According to yet another aspect of the present invention, a semiconductor device includes: a fin-shaped structure extending along a first direction on a substrate and the fin-shaped structure includes a first portion and a second portion; a shallow trench isolation (STI) around the fin-shaped structure; and a first single diffusion break (SDB) extending along a second direction between the first portion and the second portion of the fin-shaped structure. Preferably, a bottom surface of the first SDB includes a wave surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2, 4, 6, 8 are cross-sectional views illustrating the fabrication of semiconductor device along the sectional line AA' of FIG. 1

FIGS. 3, 5, 7, 9 are cross-sectional views illustrating the fabrication of semiconductor device along the sectional line BB' of FIG. 1.

DETAILED DESCRIPTION

Figure 1:
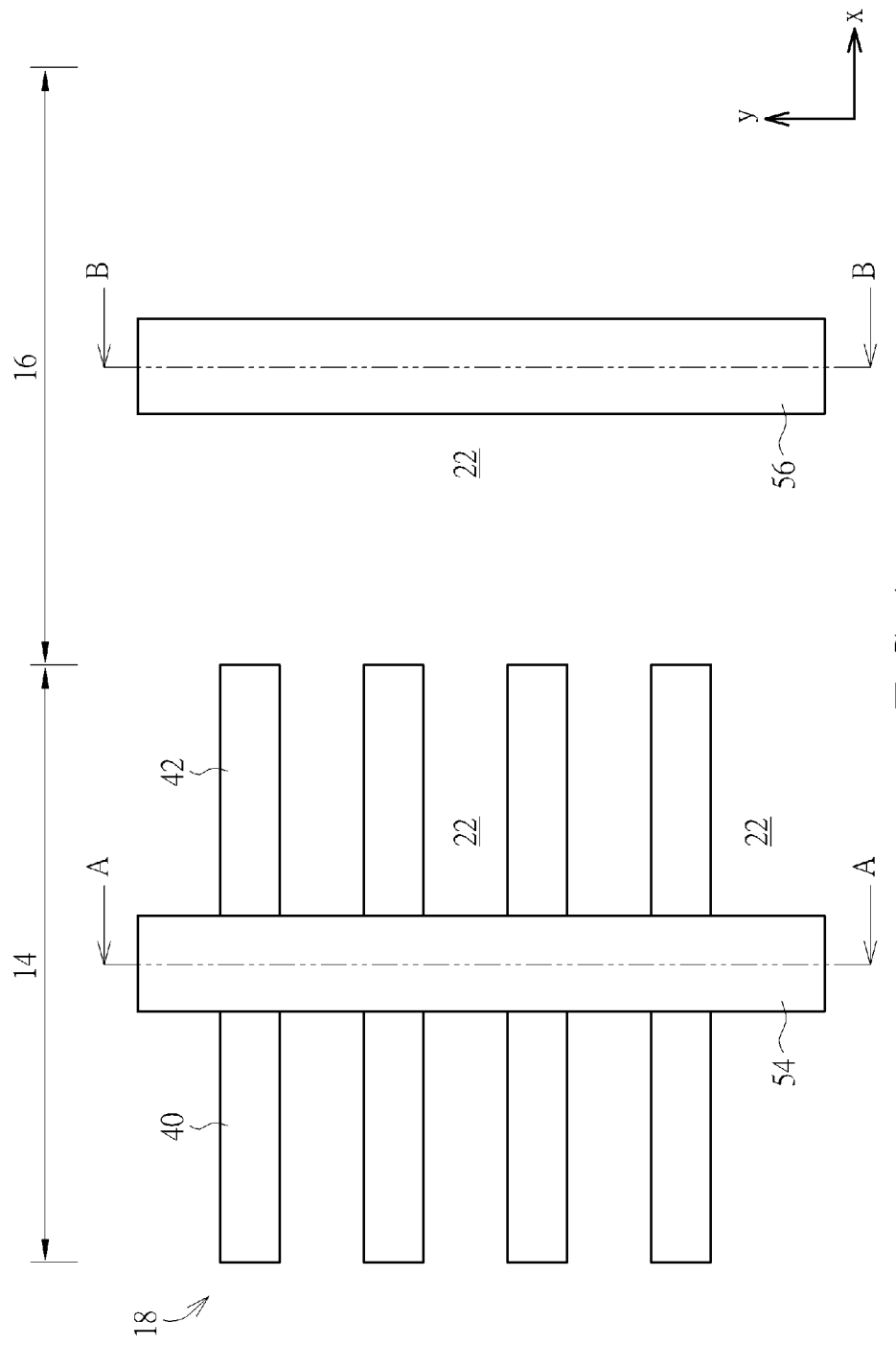
FIG. 1 is a top view illustrating a semiconductor device according to an embodiment of the present invention.
Figure 3:
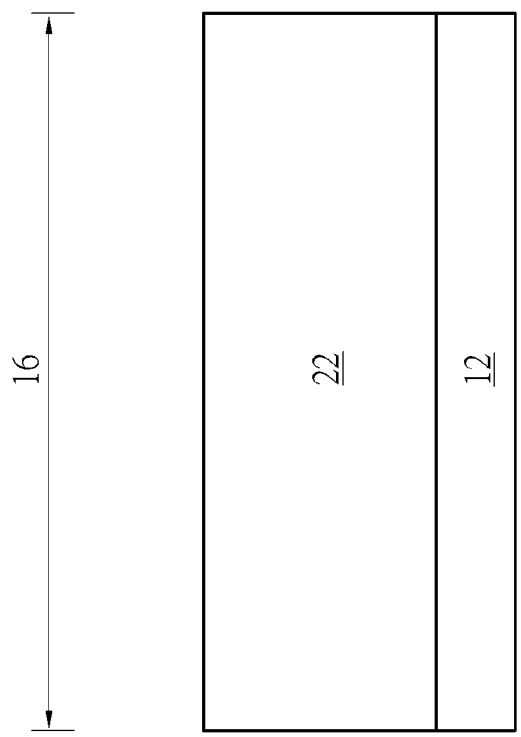
Figure 2:
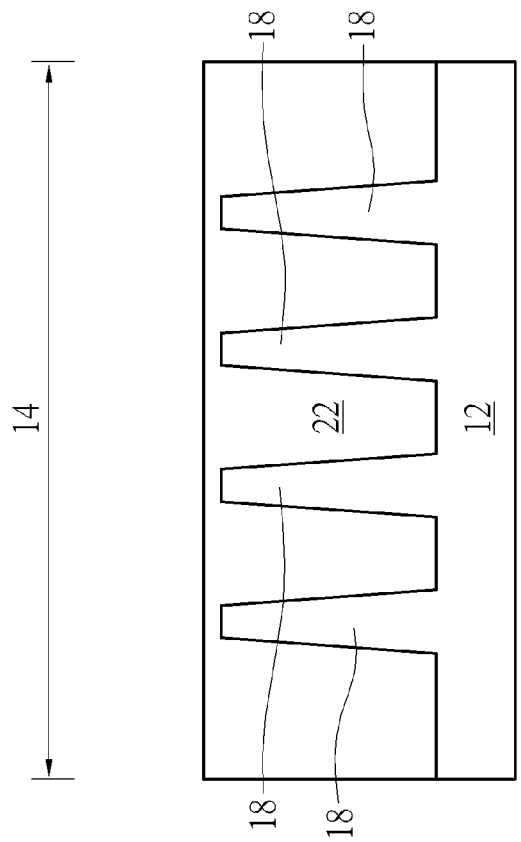

Referring to FIG. 1 and FIGS. 2-9, in which FIG. 1 is a top view illustrating a semiconductor device according to an embodiment of the present invention, FIGS. 2, 4, 6, 8 are cross-sectional views illustrating the fabrication of semiconductor device along the sectional line AA' of FIG. 1, and FIGS. 3, 5, 7, 9 are cross-sectional views illustrating the fabrication of semiconductor device along the sectional line BB' of FIG. 1. As shown in FIGS. 2-3, a substrate 12, such as a silicon substrate or silicon-on-insulator (SOI) substrate is first provided. Next, a first region 14 and a second region 16 are defined on the substrate 12, in which fin-shaped structures 18 and shallow trench isolation 22 around the fin-shaped structures 18 are disposed on the first region 14, and STI 22 but no fin-shaped structures are disposed on the second region 16 at this stage. It should be noted that even though four fin-shaped structures 18 are disposed on the first region 14 in this embodiment, it would also be desirable to adjust the number of fin-shaped structures 18 depending on the demand of the product, which is also within the scope of the present invention.

Preferably, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure 18 are all within the scope of the present invention.

Next, a shallow trench isolation (STI) 22 is formed around the fin-shaped structures 18. In this embodiment, the formation of the STI 22 could be accomplished by conducting a flowable chemical vapor deposition (FCVD) process to form a silicon oxide layer on the substrate 12 and covering the fin-shaped structures 18 entirely. Next, an etching process or a chemical mechanical polishing (CMP) process is conducted to remove part of the silicon oxide layer so that the top surface of the remaining silicon oxide is even with or slightly higher than the top surface of the fin-shaped structures 18 for forming a STI 22.

Next, an ion implantation process is conducted to implant n-type or p-type dopants into the fin-shaped structures 18, and an anneal process is accompanied to diffuse the implanted dopants for forming well regions (not shown).

Figures 4, 5:
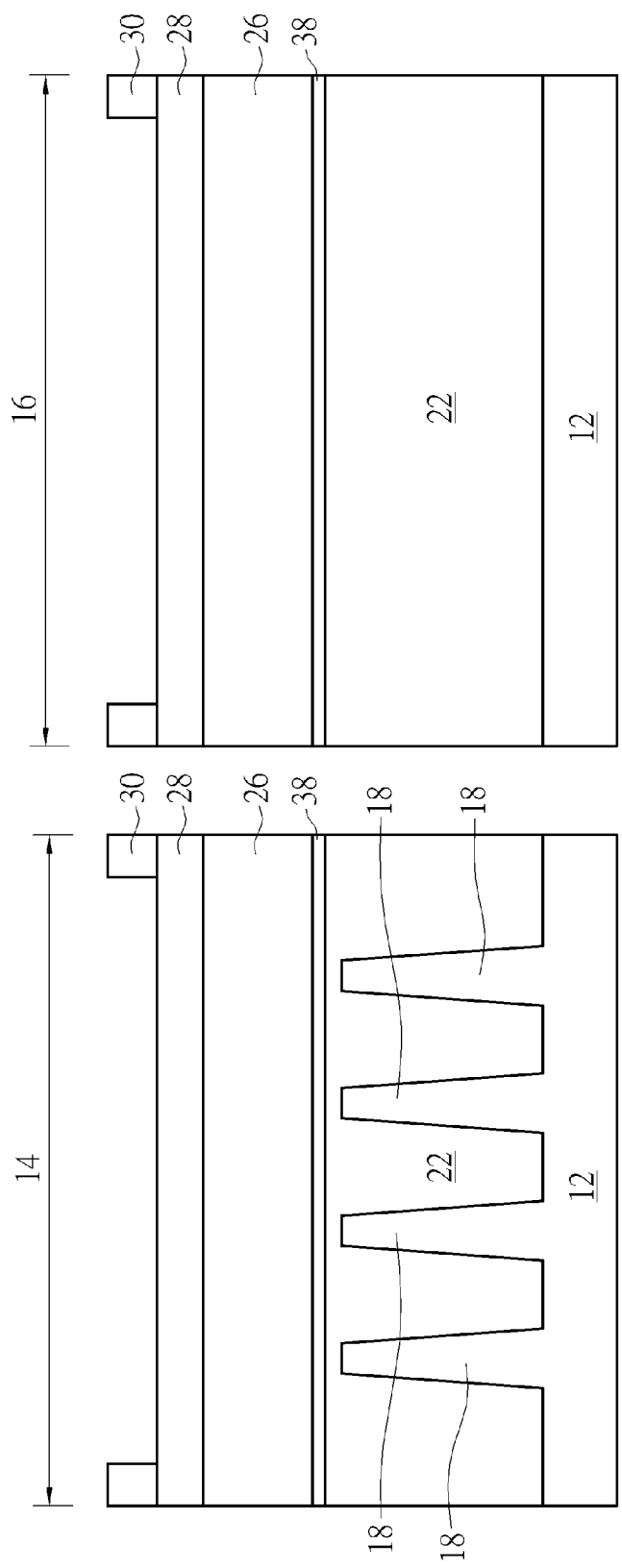

Next, referring to FIGS. 4-5, in which FIG. 4 is a cross-sectional view illustrating the process continued after FIG. 2 and FIG. 5 is a cross-sectional view illustrating the process continued after FIG. 3. As shown in FIGS. 4-5, a buffer layer 38 is formed on the fin-shaped structures 18 and STI 22, and a mask layer including but not limited to for example an organic dielectric layer (ODL) 26, a silicon-containing hard mask anti-reflective coating (SHB) 28, and a patterned resist 30 is formed on the buffer layer 38. In this embodiment, the buffer layer 38 preferably includes oxides such as silicon dioxide, but not limited thereto.

Next, referring to FIGS. 6-7, in which FIG. 6 is a cross-sectional view illustrating the process continued after FIG. 4 and FIG. 7 is a cross-sectional view illustrating the process continued after FIG. 5. As shown in FIGS. 6-7, part of the fin-shaped structures 18 and part of the STI 22 on the first region 14 are removed to form a first trench 32 and at the same time part of the STI 22 adjacent to the fin-shaped structures 18 on the second region 16 is removed to form a second trench 34. The first trench 32 formed on the first region 14 preferably divides or separates each of the fin-shaped structures 18 into a first portion 40 and a second portion 42 as shown in FIG. 1 for defining the location of a first single diffusion break (SDB) 54 formed afterwards while the second trench 34 formed on the second region 16 is used for defining the location of a second SDB 56 formed afterwards.

Specifically, the formation of the first trench 32 and second trench 34 could be accomplished by conducting a first etching process to remove part of the STI 22 and then conducting a second etching process to remove part of the fin-shaped structures 18 and the remaining STI 22 for forming the first trench 32 and second trench 34.

Viewing from a more detailed perspective, the first etching process preferably removes part of the STI 22 so that the top surface of the STI 22 is slightly lower than the top surfaces of the fin-shaped structures 18. Since no fin-shaped structures 18 are present on the second region 16, only part of the STI 22 on the second region 16 is removed during the first etching process. In this embodiment, etchant used in the first etching process could remove part of the STI 22 and small quantity of fin-shaped structures 18, in which the etchant could include but not limited to for example $CF_4$, $CHF_3$, or combination thereof. Preferably, the etching selectivity of silicon to silicon dioxide is controlled at approximately 0.9 to 1 in the first etching process so that more STI 22 made of silicon dioxide is removed while less fin-shaped structure 18 made of silicon is removed during the first etching process and also that the top surface of the remaining STI 22 is slightly lower than the top surface of the fin-shaped structures 18.

The etchant used in the second etching process on the other hand could include but not limited to for example HBr, $CF_4$, or combination thereof, in which the etchant is preferably used to remove more fin-shaped structures 18 and less STI 22. Since the top surface of the remaining STI 22 on the first region 14 from the first etching process is already slightly lower than the top surface of the fin-shaped structures 18, it would be desirable to adjust the etching selectivity of silicon to silicon dioxide to about 2:1 so that more fin-shaped structures 18 made of silicon is removed while less STI 22 made of silicon dioxide is removed. Similar to the first etching process, since only STI 22 is disposed on the second region 16, only part of the STI 22 on the second region 16 is removed during the second etching process.

According to an embodiment of the present invention, since both fin-shaped structures 18 and STI 22 are disposed on the first region 14 while only STI 22 is disposed on the second region 16, a bottom surface of the first trench 32 after the aforementioned first etching process and second etching process preferably is modified or changed into a non-planar surface or more specifically a wave surface 44 while the bottom surface of the second trench 34 includes a planar surface 46. It should be noted that since the etching selectivity used in the second etching process is greater toward silicon than silicon dioxide, the bottom of the waved surface or curve 48 formed by removing the fin-shaped structures 18 in the first trench 32 is slightly lower than the bottom of wave surface or curve 50 formed by removing the adjacent STI 22.

Next, referring to FIGS. 8-9, in which FIG. 8 is a cross-sectional view illustrating the process continued after FIG. 6 and FIG. 9 is a cross-sectional view illustrating the process continued after FIG. 7. As shown in FIGS. 8-9, a dielectric layer 52 is formed into the first trench 32 and second trench 34 to fill the first trench 32 and second trench 34 completely, and a planarizing process such as etching back or CMP process is conducted to remove part of the dielectric layer 52 so that the top surface of the remaining dielectric layer 52 is even with the top surface of the buffer layer 38. This forms a first SDB 54 in first trench 32 and a second SDB 56 in the second trench 34. According an embodiment of the present invention, it would also be desirable to remove the remaining buffer layer 38 completely while part of the dielectric layer 52 is removed during the aforementioned planarizing process so that the top surface of the remaining dielectric layer 52 is even with the top surface of the STI 22, which is also within the scope of the present invention. In this embodiment, the dielectric layer 52 and the STI 22 are preferably made of different material. For instance, the dielectric layer 52 deposited into the first trench 32 and second trench 34 preferably includes silicon nitride and the STI 22 is preferably made of silicon dioxide, but not limited thereto.

Next, a standard FinFET fabrication process could be conducted thereafter by forming gate structure (not shown) intersecting the first portion 40 and second portion 42 of fin-shaped structures 18 on the first region 14, forming spacer around the gate structure, and forming element such as source/drain region in the first portion 40 and second portion 42 adjacent to two sides of the spacer. Since the FinFET process is well known to those skilled in the art, the details of which are not explained herein for the sake of brevity.

Referring again to FIG. 1 and FIGS. 8-9, which further illustrate structural views of a semiconductor device according to an embodiment of the present invention. As shown in FIGS. 1 and 8, the semiconductor device preferably includes fin-shaped structures 18 extending along a first direction (such as X-direction) on the substrate 12 while each of the fin-shaped structures 18 includes a first portion 40 and a second portion 42, a STI 22 around the fin-shaped structures 18, a first SDB 54 extending along a second direction (such as Y-direction) between the first portion 40 and second portion 42, and a second SDB 56 extending along the second direction in the STI 22 adjacent to the fin-shaped structures 18.

Specifically, a first region 14 and a second region 16 are defined on the substrate 12, in which at least a fin-shaped structure 18, a first SDB 54, and a STI 22 around the fin-shaped structures 18 are disposed on the first region 14, and a second SDB 56 and STI 22 are disposed on the second region 16 while no fin-shaped structures are disposed on the second region 16. In this embodiment, the first SDB 54 and STI 22 are preferably made of different material, the second SDB 56 and STI 22 are made of different material, and the first SDB 54 and second SDB 56 are made of same material. Preferably, the STI 22 includes silicon dioxide while both the first SDB 54 and second SDB 56 include silicon nitride.

It should be noted that even though the first SDB 54 and second SDB 56 are disposed in parallel on the first region 14 and second region 16 respectively while the top and bottom surfaces of the first SDB 54 are even or aligned with the top and bottom surfaces of the second SDB 56, it would also be desirable to adjust the quantity, length, and position of the second SDB 56 depending on the demand of the product by forming a plurality of second SDBs 56 extending along a Y-direction in the STI 22 on second region 16 while each of the second SDBs 56 could have equal or different length from the first SDB 54.

Moreover, as shown in FIGS. 8-9, the bottom surface of the first SDB 54 on first region 14 preferably includes a wave surface 44 while the bottom of the second SDB 56 on second region 16 includes a planar surface 46. Specifically, the wave surface 44 includes a plurality of arcs or curves 48 and 50 with different curvature and/or depths and since the wave surface 44 is disposed between the first SDB 54 and the substrate 12, if viewing from another angle not only does the bottom surface of first SDB 54 includes wave surface the top surface of the substrate 12 also includes the same wave surface 44.

Typically, the fabrication of SDB is accomplished by dividing a fin-shaped structure into two portions through an etching process to form a trench therebetween and then deposit dielectric material such as silicon nitride into the trench to form the so-called SDB structure. Due to the limitation of etching technique used today, a shrink phenomenon is common observed during the fabrication of SDB so that the resulting fin-shaped structure could not have been divided properly thereby causing an etching bias issue. In order to resolve this issue, the present invention preferably forms one or multiple dummy SDB structure (such as the second SDB 56 in the aforementioned embodiment) in the STI adjacent to the fin-shaped structures while a typical SDB structure (such as the first SDB 54 in the aforementioned embodiment) is fabricated. Preferably, it would be desirable to improve the above etching bias issue significantly with the presence of the dummy SDB structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a fin-shaped structure on a substrate;
    forming a shallow trench isolation (STI) around the fin-shaped structure;
    removing part of the fin-shaped structure and part of the STI to form a first trench and removing part of the STI adjacent to the fin-shaped structure to form a second trench; and
    forming a dielectric layer into the first trench and the second trench to forma first single diffusion break (SDB) and a second single diffusion break.

2. The method of claim 1, further comprising:
    performing a first etching process to remove part of the STI; and
    performing a second etching process to remove part of the fin-shaped structure and the remaining STI to form the first trench.

3. The method of claim 2, further comprising performing the first etching process to remove part of the STI so that a top surface of the STI is lower than a top surface of the fin-shaped structure.

4. The method of claim 1, wherein a bottom surface of the first trench comprises a wave surface and a bottom surface of the second trench comprises a planar surface.

5. The method of claim 1, wherein a bottom surface of the first SDB comprises a wave surface and a bottom surface of the second SDB comprises a planar surface.

6. The method of claim 1, wherein the STI comprises silicon dioxide.

7. The method of claim 1, wherein the dielectric layer and the STI comprise different material.

8. The method of claim 1, wherein the dielectric layer comprises silicon nitride.

9. A semiconductor device, comprising:
    a fin-shaped structure extending along a first direction on a substrate, wherein the fin-shaped structure comprises a first portion and a second portion;
    a shallow trench isolation (STI) around the fin-shaped structure;
    a first single diffusion break (SDB) extending along a second direction between the first portion and the second portion of the fin-shaped structure; and
    a second SDB extending along the second direction in the STI and adjacent to the fin-shaped structure.

10. The semiconductor device of claim 9, wherein the STI comprises silicon dioxide.

11. The semiconductor device of claim 9, wherein the first SDB and the STI comprise different material.

12. The semiconductor device of claim 9, wherein the first SDB and the second SDB comprise same material.

13. The semiconductor device of claim 9, wherein the first SDB and the second SDB comprise silicon nitride.

14. A semiconductor device, comprising:
    a fin-shaped structure extending along a first direction on a substrate, wherein the fin-shaped structure comprises a first portion and a second portion;
    a shallow trench isolation (STI) around the fin-shaped structure; and a first single diffusion break (SDB) extending along a second direction between the first portion and the second portion of the fin-shaped structure, wherein a bottom surface of the first SDB comprises a wave surface.

15. The semiconductor device of claim 14, further comprising:
a second SDB extending along the second direction in the STI and adjacent to the fin-shaped structure, wherein a bottom surface of the second SDB comprises a planar surface.

16. The semiconductor device of claim 15, wherein the first SDB and the second SDB comprise same material.

17. The semiconductor device of claim 15, wherein the first SDB and the second SDB comprise silicon nitride.

18. The semiconductor device of claim 14, wherein the first SDB and the STI comprise different material.

* * * * *